(12) United States Patent
Lehtonen et al.

(10) Patent No.: US 8,933,546 B2
(45) Date of Patent: Jan. 13, 2015

(54) ELECTRONIC ASSEMBLY WITH IMPROVED THERMAL MANAGEMENT

(75) Inventors: Paeivi Lehtonen, Fellbach (DE); Thomas Kaden, Schwieberdingen (DE); Denis Gugel, Gerlingen (DE); Thomas Suenner, Stuttgart (DE); Tim Behrens, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/978,436

(22) PCT Filed: Nov. 11, 2011

(86) PCT No.: PCT/EP2011/069955
§ 371 (c)(1), (2), (4) Date: Jul. 5, 2013

(87) PCT Pub. No.: WO2012/092994
PCT Pub. Date: Jul. 12, 2012

(65) Prior Publication Data
US 2013/0277812 A1 Oct. 24, 2013

(30) Foreign Application Priority Data
Jan. 5, 2011 (DE) .......................... 10 2011 002 458

(51) Int. Cl.
*H01L 23/495* (2006.01)
*H01L 23/433* (2006.01)
*H01L 23/00* (2006.01)

(52) U.S. Cl.
CPC ...... *H01L 23/49568* (2013.01); *H01L 23/4334* (2013.01); *H01L 23/49503* (2013.01);
(Continued)

(58) Field of Classification Search
CPC ................ H01L 23/32; H01L 23/4334; H01L 23/49503; H01L 23/49562; H01L 23/49568; H01L 2224/32245; H01L 23/36; H01L 25/07; H01L 23/488; H01L 2224/32014
USPC .................................. 257/666, 698
See application file for complete search history.

(56) References Cited

U.S. PATENT DOCUMENTS 4,700,273 A 10/1987 Kaufman
5,345,106 A * 9/1994 Doering et al. ............... 257/675
(Continued)

FOREIGN PATENT DOCUMENTS

DE 4017697 12/1991
DE 60017304 12/2005
(Continued)

OTHER PUBLICATIONS

International Search Report for Application No. PCT/EP2011/069955 dated Feb. 21, 2012 (2 pages).

*Primary Examiner* — Alexander Oscar Williams
(74) *Attorney, Agent, or Firm* — Michael Best & Friedrich LLP

(57) ABSTRACT

An electronic assembly includes a leadframe (2), a semiconductor component (3), and an electrically conductive connecting element (4) made of a composite material (5). The connecting element (4) has a solderable metallization (6) on the composite material (5) on a surface that is directed towards the semiconductor component (3). A thermal conductivity of the composite material (5) of the connecting element (4) is greater than a thermal conductivity of the semiconductor component (3) and less than a thermal conductivity of the leadframe (2). The connecting element (4) is provided only locally in the region of the semiconductor component (3).

11 Claims, 4 Drawing Sheets

(52) U.S. Cl.
CPC .......... *H01L23/49562* (2013.01); *H01L 24/32* (2013.01); *H01L 2224/32245* (2013.01); *H01L 2924/13055* (2013.01); *H01L 2924/13091* (2013.01)
USPC .......................................... 257/666; 257/698

(56) References Cited

U.S. PATENT DOCUMENTS

| | | | |
|---|---|---|---|
| 6,114,048 | A | 9/2000 | Jech et al. |
| 2004/0031545 | A1 | 2/2004 | Okamoto et al. |

FOREIGN PATENT DOCUMENTS

| | | |
|---|---|---|
| JP | 49-40868 | 4/1974 |
| JP | 49040868 | 4/1974 |
| JP | 56070650 | 6/1981 |
| JP | H0231863 | 7/1990 |
| JP | 4329660 | 11/1992 |
| JP | H04359458 | 12/1992 |
| JP | 2006500774 | 1/2006 |
| JP | 2007142126 | 6/2007 |
| JP | 2008028286 | 2/2008 |
| JP | 2009513026 | 3/2009 |
| JP | 2010219524 | 9/2010 |

* cited by examiner

ELECTRONIC ASSEMBLY WITH IMPROVED THERMAL MANAGEMENT

BACKGROUND OF THE INVENTION

The present invention relates to an electronic assembly with improved thermo-management by means of locally adapted, improved thermomechanical stability.

Electronic assemblies are known from prior art, wherein power semiconductors are directly soldered to substrates, in particular leadframes, specifically in low voltage applications. Such electronic assemblies have good thermal properties because heat from the power semiconductor can be directly transferred to the leadframe, and the leadframe then quickly leads the heat away from the power semiconductor. A big disadvantage with these directly contacted electronic assemblies, however, results from the large differences between the thermal expansion coefficients of the power semiconductors and the leadframe, typically a metal sheet. As a result, thermomechanical stresses can result between leadframe and power semiconductor, which in extreme cases leads to the destruction of the component.

SUMMARY OF THE INVENTION

The electronic assembly of the invention has in contrast the advantage that greatly reduced thermally based stresses between a leadframe and a semiconductor component are possible; thus enabling a service life of the electronic assembly to be significantly lengthened. In addition, the electronic assembly according to the invention can nevertheless be very cost-effectively manufactured in serial production. In particular, only a minimal increase in costs occurs in comparison to a direct equipping of the leadframe with semiconductor components. This results from the fact that an electrically conductive connecting element is provided according to the invention only locally in the region of the semiconductor component. The electrically conductive connecting element is thereby manufactured from a composite material, a solderable metallization being provided on a surface that is directed towards the semiconductor component. In so doing, the connecting element is interposed according to the invention for the heat transfer from the semiconductor component to the leadframe. A thermal conductivity of the connecting element thereby lies between that of the semiconductor component and that of the leadframe. It is furthermore possible according to the invention for the electronic assembly not only to be used in low voltage applications but also in high performance applications, in which the semiconductor component produces much heat. According to the invention, a leadframe can therefore still be used which can be simply and cost-effectively manufactured, the connecting element made of a composite material facilitating much latitude for variation with regard to composition, layer thickness etc.

A face of the locally provided connecting element is preferably maximally twice as large as a face of the semiconductor component. As a result, good heat dissipation can on the one hand be facilitated and on the other hand, the costs for manufacturing the connecting element and the space requirement necessary for said connecting element remain within reasonable limits. In a particularly preferable manner, a face of the connecting element is thereby the same size as a face of the semiconductor component; thus enabling the heat dissipation from an entire lower surface of said semiconductor component to be ensured.

According to a preferred exemplary embodiment of the invention, the leadframe advantageously comprises a punched-out section in which the connecting element is disposed. The punched-out section is thereby provided at a position whereat a semiconductor component is disposed in the subsequently completed electronic assembly. The punched-out section is produced simultaneously with the manufacture of the leadframe and thus does not entail any additional costs. Said punched-out section furthermore defines the position of the connecting element; thus enabling said element to be quickly and simply disposed in the leadframe. In addition, the connecting element thus does not protrude or protrudes only to a slight extent beyond a face of the leadframe, and therefore a compact electronic assembly is possible.

A thickness of the connecting element is preferably equal to a thickness of the leadframe. Hence, the connecting element replaces the punched out material from the leadframe without a semiconductor component being thereby disposed excessively raised with respect to a face of the leadframe.

According to a preferred embodiment of the invention, the leadframe comprises a recessed impression, the composite element being disposed in the impression. In so doing, an impression is provided which also does not significantly add to the manufacturing costs of the leadframe because the indentation is simultaneously produced with said leadframe. The impression then serves as a pocket for receiving the connecting element, whereby a superelevated disposal of the semiconductor element disposed on said connecting element is prevented as well.

In a particularly preferential manner, a surface of the leadframe is flush with a surface of the connecting element.

In a particularly preferred manner, the connecting element is provided as a prepared component so that said connecting element has merely to be disposed on the leadframe.

In order to ensure a particularly fast and cost effective manufacturability, a press fit is provided between the connecting element and the leadframe. The press fit can thereby be provided at the punched-out section as well as at the impression. A bonded connection can alternatively or additionally be provided between said connecting element and said lead frame. In a particularly preferred manner, the bonded connection is produced by means of a galvanization process. Said connecting element is provided in this context as a galvanically deposited dispersion layer in the locally delimited region. To this end, foreign particles are introduced into a galvanic bath, which particles are then incorporated into the growing layer during the galvanization process. In a particularly preferred manner, very coarse particles are thereby inserted into the recess or, respectively, into the indentation, and a metallic layer grows around said particles until the connecting element is produced.

In a particularly preferred manner, the connecting element has a copper-molybdenum composite or a copper-graphite composite as composite material.

In a particularly preferred manner, the connecting element has a coefficient of thermal conductivity in the range of 100 to 900 W/m-K.

The semiconductor component is preferably an FET, in particular a MOSFET or an IGBT.

In a particularly preferred manner, the inventive electronic assembly is used in motor vehicles as a power module. In this context, the inventive electronic assembly can be used in the drive area and/or in energy management, in particular also in hybrid vehicles, fuel cell vehicles and electric vehicles. The inventive electronic assembly can also be used in the area of renewable energy, for example in photovoltaic inverters.

BRIEF DESCRIPTION OF THE DRAWINGS

Preferred exemplary embodiments of the invention are described below in detail with reference to the accompanying drawings. In the drawings.

DETAILED DESCRIPTION

An electronic assembly 1 pursuant to a first preferred exemplary embodiment of the invention is described below in detail with reference to FIGS. 1 to 4.

Figure 1:
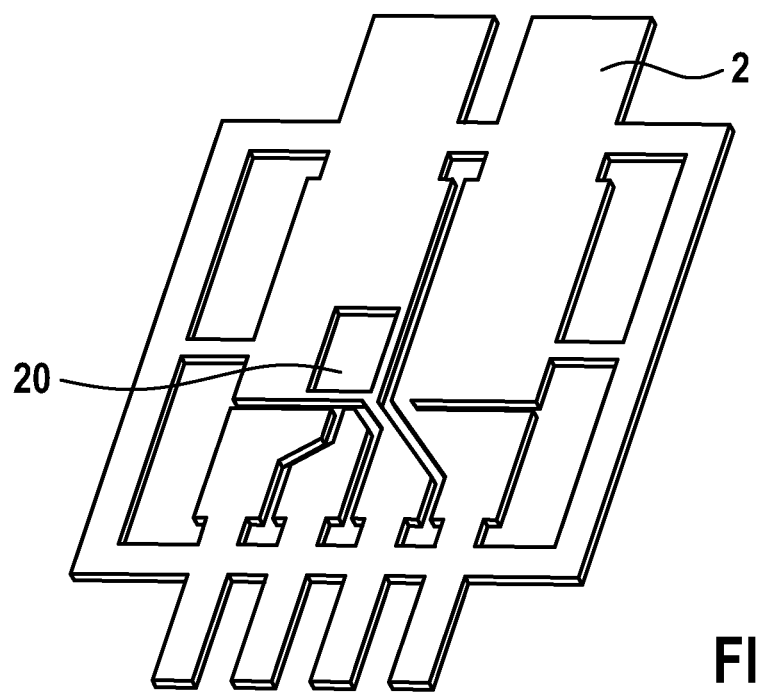
FIG. 1 shows a schematic, perspective view of a leadframe for an inventive electronic assembly pursuant to a first exemplary embodiment.
Figure 2:
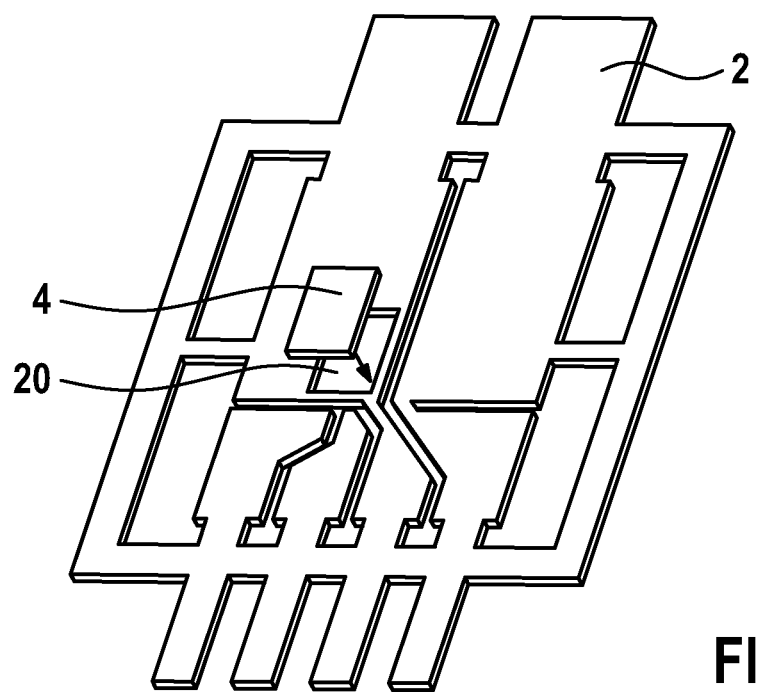
FIG. 2 shows a perspective depiction of the leadframe from FIG. 1, which illustrates the assembly process of a connecting element.
Figure 3:
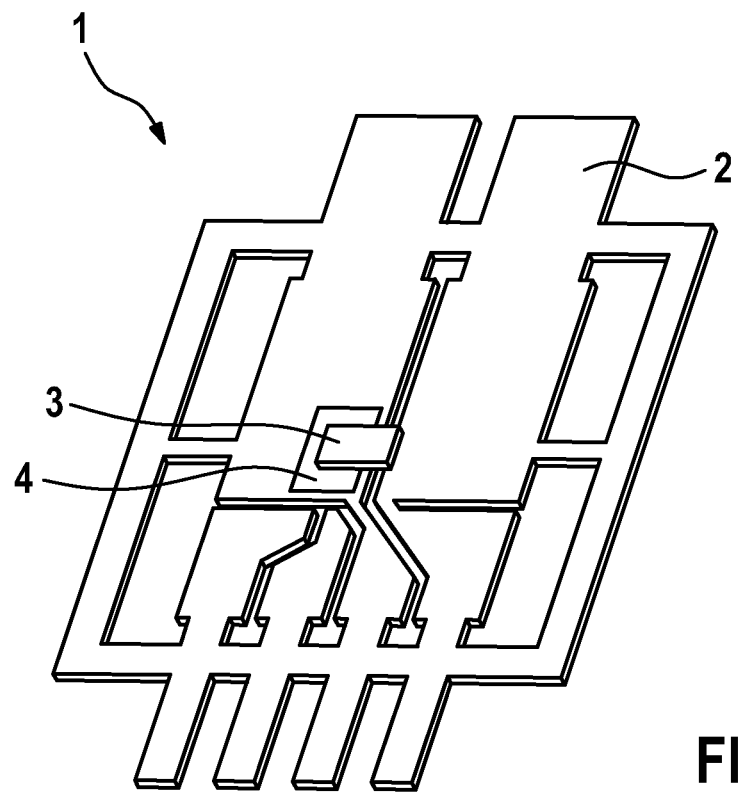
FIG. 3 shows a perspective depiction of the leadframe from FIG. 1 comprising the subsequently assembled semiconductor component.
Figure 4:
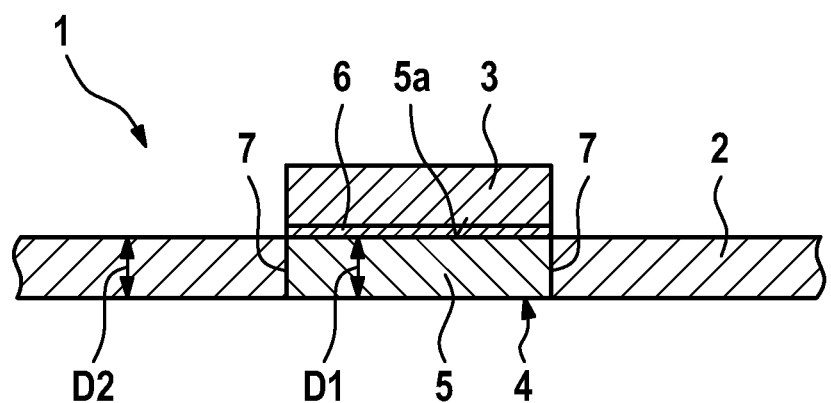
FIG. 4 shows a schematic sectional view through the electronic assembly from FIG. 3.
Figure 5:
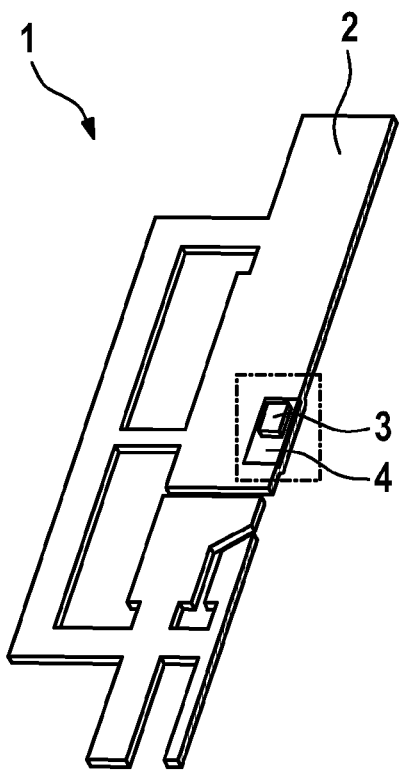
FIG. 5 shows a schematic, perspective depiction of an electronic assembly pursuant to a second exemplary embodiment of the invention.
Figure 6:
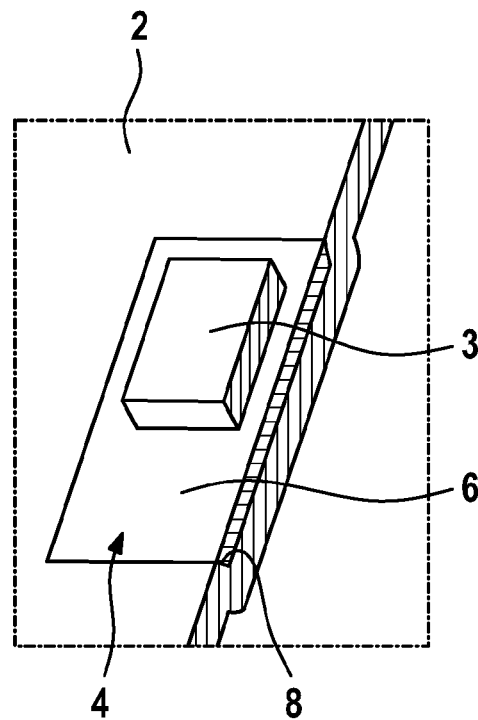
FIG. 6 shows an enlarged depiction of FIG. 5.

As can particularly be seen from FIG. 4, the electronic assembly 1 comprises a leadframe 2 made of copper, a semiconductor component 3 and a connecting element 4. As can be seen in FIG. 1, an additional recess 20 is provided in the leadframe 2, the former being punched-out simultaneously with the manufacture of the leadframe. The composite element, which was provided in advance as a prefabricated component, comprises dimensions, which allow it to be inserted into the recess 20 by means of a press fit (cf. FIG. 2). The composite element 4 is thereby manufactured from a copper-graphite composite material. The composite material 5 has a solderable metallization 6, i.e. a very thin metal layer, on a side directed towards the semiconductor component 3. As a result, the semiconductor component 3 can be soldered to the connecting element 4.

A surface of the connecting element 4 thereby corresponds exactly to a surface of the semiconductor component 3. Moreover, a thickness D1 of the connecting element 4 equals a thickness D2 of the leadframe 2. This prevents the semiconductor element 3 from protruding too far outward due to the use of the connecting element 4. Said connecting element 4 can thus be provided as a prefabricated component comprising suitable dimensions and can be press fit quickly and simply into the recess 20. The semiconductor component 3 is subsequently attached to the metallization 6 on said connecting element 4 by means of a soldering operation. Finally the connecting element which has been prefabricated in this manner can be assembled to the leadframe.

The thermal expansion coefficients of the connecting element 4, the semiconductor component 3 and the leadframe 2 are adapted to one another such that a large value jump between adjacent thermal expansion coefficients is avoided. For example, the connecting element 4 thereby has a thermal conductivity which is greater than a thermal conductivity of the semiconductor component 3, which is, however, less than a thermal conductivity of the leadframe 2. As a result, good heat dissipation by the semiconductor component 3 can still be ensured without large thermal stresses occurring between said semiconductor component 3 and said leadframe 2. The connecting element 4 therefore prevents too large of thermal stresses from occurring between said leadframe 2 and said semiconductor component 3. According to the invention, a simple stamping grid construction can nevertheless be maintained using the leadframes, an adaptation to regions on the semiconductor components which are particularly thermally stressed being facilitated only locally. A minimization of costs of the relatively expensive composite material of the connecting element is furthermore achieved by the merely local adaptation. According to the invention, a specific adaptation to individual circumstances can furthermore be facilitated by changing the composition of the materials of the composite material 5. Depending on the desired properties, a mixture of a metal with ceramics can, for example, be facilitated with regard to improved thermal conductivity or electrical conductivity. The electronic assembly can also be manufactured in such a manner that no direct contact is present between leadframe 2 and semiconductor component 3, but contact only results via the connecting element 4.

An electronic assembly 1 pursuant to a second exemplary embodiment of the invention is described below in detail with reference to FIGS. 5 to 10. Identical or functionally identical parts are thereby denoted with the identical reference numerals as in the first exemplary embodiment.

Figure 7:
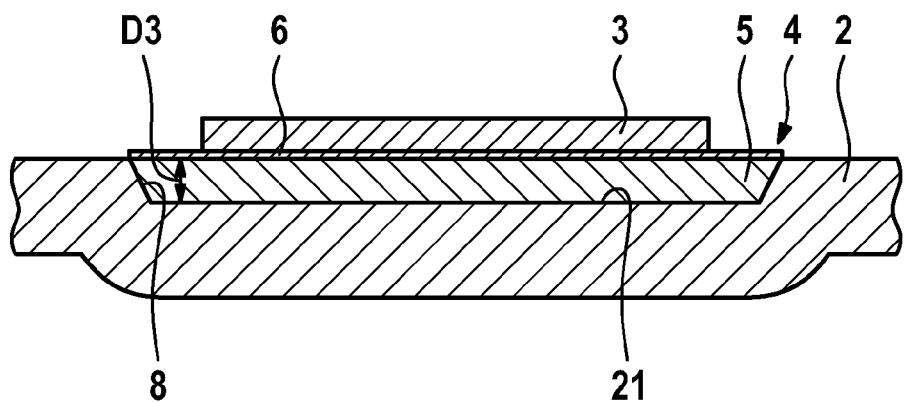
FIG. 7 shows a schematic sectional view through the electronic assembly of the second exemplary embodiment.

As can be seen from FIG. 7, the leadframe comprises in contrast to the first exemplary embodiment an impression 21 instead of a punched-out section. The impression 21 is preferably produced at the same time as the otherwise necessary step of punching out the leadframe 2. A conical edge of the impression 21 is denoted with the reference numeral 8. Likewise no further additional costs are occurred as a result of this step. The impression 21 is thereby completely filled with the composite material 5 of the connecting element 4. A thickness D3 of the composite material 5 thereby corresponds to a depth of the impression 21 on a surface of the leadframe 2. As a result, the surface of the leadframe 2 is flush with the surface of the connecting element. The thickness of the metallization 6 is depicted in an exaggerated manner in FIG. 7 and can be ignored when considering the thickness.

Figure 8:
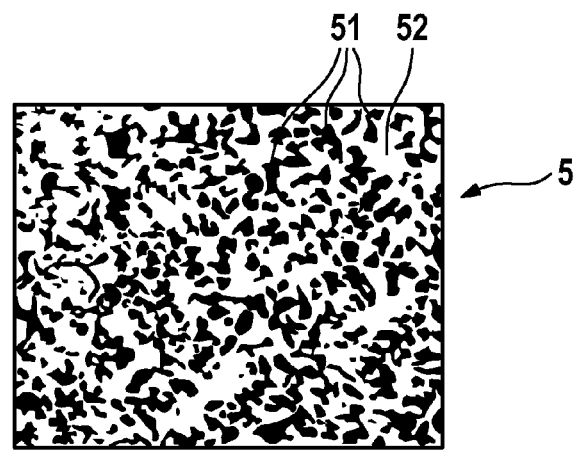
FIG. 8 shows an enlargement of the sectional area of the connecting element, FIG. 9 show one example for manufacturing the connecting element.

FIG. 8 shows a section through the composite material 5 which is produced from two materials, namely a first material 51 in powder form as, e.g., graphite, and a metal material 52 which occupies the interstices between the granular material 51.

The impressions 21 are in turn configured at the positions, at which the semiconductor components 3 are subsequently disposed. Provision is, however, made for another metallization 6 prior to assembly of the semiconductor component 3. Because the metallization 6 is very thin, said metallization does not have to be taken into account with regard to a height build-up of the assembly. The metallization 6 is, however, formed only in the region on the connecting element 4, to which the semiconductor component 3 is subsequently soldered.

Figures 9, 10:
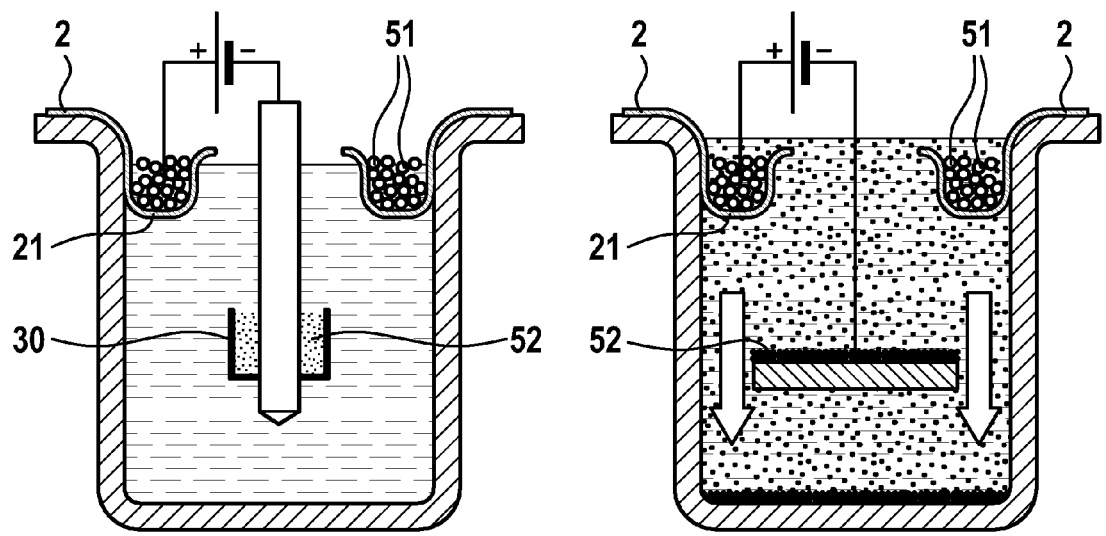
FIG. 10 shows another example for manufacturing the connecting element.

FIGS. 9 and 10 show two exemplary embodiments of manufacturing processes for manufacturing the leadframe 2 using composite material 5. In so doing, the composite material 5 is generated as a galvanically deposited dispersion layer in the impression 21. Coarse particles 51 are preferably used here, which, supported by the force of gravity, can then be disposed in the impressions 21. After a voltage has been applied, metallic foreign particles 52 are deposited in the impression 21, as can be seen in FIG. 9; thus enabling a metallic layer to grow around the large particles which were inserted beforehand. Ceramic or intermetallic particles are, for example, suitable as particles. In FIG. 9, the metallic foreign particles are disposed in a receptacle 30 around an electrode in an electrolyte. In FIG. 10, the metallic foreign particles 52 are present in a dispersion.

In the second exemplary embodiment, provision can therefore also be made locally for a connecting element 4, which is made of a composite material 5 comprising metallization disposed thereon. The use of the impression 21 also offers further advantages in particular with regard to subsequent insulation because the surface to be insulated is thereby reduced.

It should be noted that it is also possible according to the invention for a connecting element 4 to be applied only locally to a surface of a leadframe 2. This can, however, frequently lead to positioning irregularities; and therefore the variants described in both of the exemplary embodiments preferably comprise a punched-out section or an impression 21. It should be noted that it is, of course, also possible for a punched-out section as well as an impression 21 to be jointly provided in the leadframe for two different components.

It is also alternatively possible for the inventive composite material to be manufactured such that it is extensively deposited on a substratum and is then separated corresponding to the respectively desired size and subsequently, as described in the first exemplary embodiment, inserted in respectively formed punched-out sections.

The invention claimed is:

1. An electronic assembly, comprising:
   a leadframe (2) including a recessed impression (21),
   a semiconductor component (3), and
   an electrically conductive connecting element (4) made of composite material (5), the composite material (5) of the connecting element (4) being disposed in the recessed impression (21),
   wherein the connecting element (4) has a solderable metallization (6) on the composite material (5) on a surface that is directed towards the semiconductor component (3),
   wherein a thermal conductivity of the composite material (5) of the connecting element (4) is greater than a thermal conductivity of the semiconductor component (3) and less than a thermal conductivity of the leadframe (2), and
   wherein the connecting element (4) is provided only locally in the region of the semiconductor component (3).

2. The assembly according to claim 1, characterized in that a face of the connecting element (4) is maximally twice as large as a face of the semiconductor component (3).

3. The assembly according to claim 1, characterized in that the leadframe (2) has a punched-out section (20), in which an additional electrically conductive connecting element (4) is disposed.

4. The assembly according to claim 3, characterized in that the composite material (5) of the connecting element (4) has a thickness (D1) which is equal to a thickness (D2) of the leadframe (2).

5. The assembly according to claim 1, characterized in that the connecting element (4) is a component manufactured in advance.

6. The assembly according to claim 1, characterized in that a press-fit connection (7) is formed between the connecting element (4) and the leadframe (2).

7. The assembly according to claim 1, characterized by a bonded connection (8) between the composite material (5) of the connecting element (4) and the leadframe (2).

8. The assembly according to claim 1, characterized in that a surface of the connecting element (4) is flush with a surface of the leadframe (2).

9. The assembly according to claim 1, characterized in that the composite material (5) comprises copper and graphite.

10. The assembly according to claim 1, characterized in that a face of the connecting element (4) is the same size as a face of the semiconductor component (3).

11. The assembly according to claim 1, characterized in that the composite material (5) comprises copper and molybdenum.

* * * * *